(12) United States Patent
Li et al.

(10) Patent No.: US 11,502,671 B2
(45) Date of Patent: Nov. 15, 2022

(54) DIGITAL PULSE-WIDTH MODULATION (PWM) MODULATOR WITH DYNAMICALLY SWITCHABLE CODE SET FOR REDUCED TOTAL HARMONIC DISTORTION AND NOISE (THDN)

(71) Applicant: Cirrus Logic International Semiconductor Ltd., Edinburgh (GB)

(72) Inventors: Qiang Li, Austin, TX (US); Rahul Singh, Austin, TX (US); Paul Astrachan, Austin, TX (US); Kyehyung Lee, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 180 days.

(21) Appl. No.: 17/162,950

(22) Filed: Jan. 29, 2021

(65) Prior Publication Data

US 2022/0247389 A1 Aug. 4, 2022

(51) Int. Cl.
*H03K 3/017* (2006.01)
*H04R 3/00* (2006.01)
*H03M 3/00* (2006.01)

(52) U.S. Cl.
CPC .............. *H03K 3/017* (2013.01); *H03M 3/50* (2013.01); *H04R 3/00* (2013.01)

(58) Field of Classification Search
CPC ...... H03K 3/017; H03M 3/50; H03M 7/3026; H03M 7/3037; H04R 3/00; H03F 3/38
USPC ........................................... 381/94.2; 310/10
See application file for complete search history.

(56) References Cited

U.S. PATENT DOCUMENTS

| 10,727,860 B1 | 7/2020 | Shum et al. |
| 2011/0298433 A1* | 12/2011 | Tam ........................ H01F 38/00 323/282 |

FOREIGN PATENT DOCUMENTS

CN 102832948 A * 12/2012

* cited by examiner

*Primary Examiner* — Vivian C Chin
*Assistant Examiner* — Friedrich Fahnert
(74) *Attorney, Agent, or Firm* — E. Alan Davis; Huffman Law Group, PC

(57) ABSTRACT

A digital PWM modulator modulates a digital input signal to drive a PWM signal to a PWM DAC susceptible to introducing inter-symbol interference (ISI) in small PWM edge separation presence causing audio THDN degradation. A multi-bit quantizer switches from a first to second mode when the input signal rises above a threshold. The quantizer quantizes the input signal into a quantized output signal, each sample of which has a code selected from respective first and second quantization code sets. The second set, relative to the first set, causes the digital PWM signal to have increased edge separation to reduce the ISI at high input levels. The first set includes small magnitude codes relative to the second set to reduce quantization noise at low input levels. The threshold is sufficiently low to cause the quantized output signal to be dominated by small codes when operating in the first mode.

20 Claims, 4 Drawing Sheets

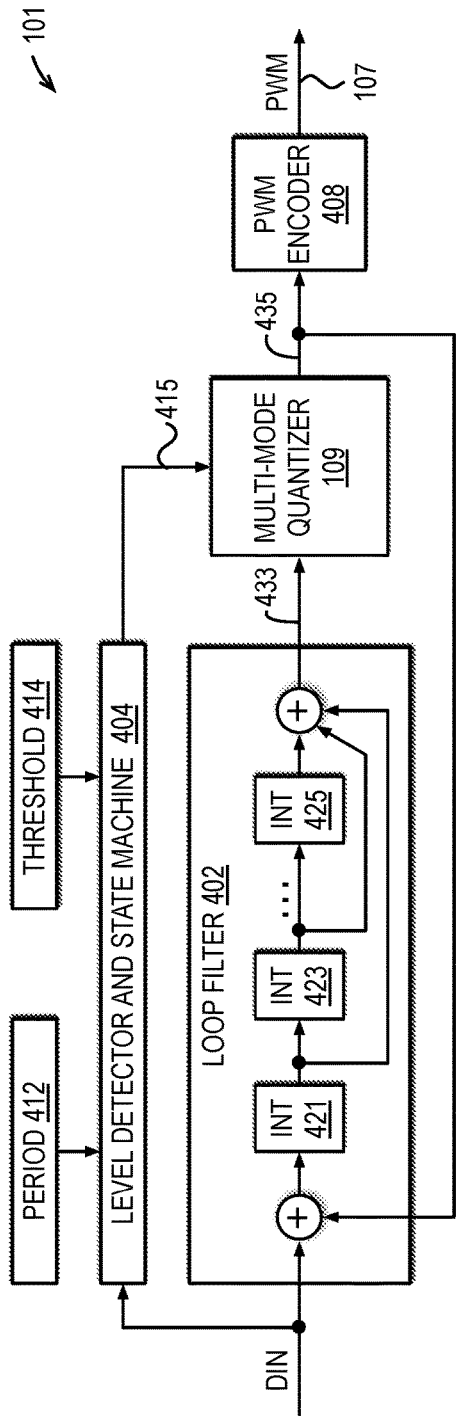
FIG. 4
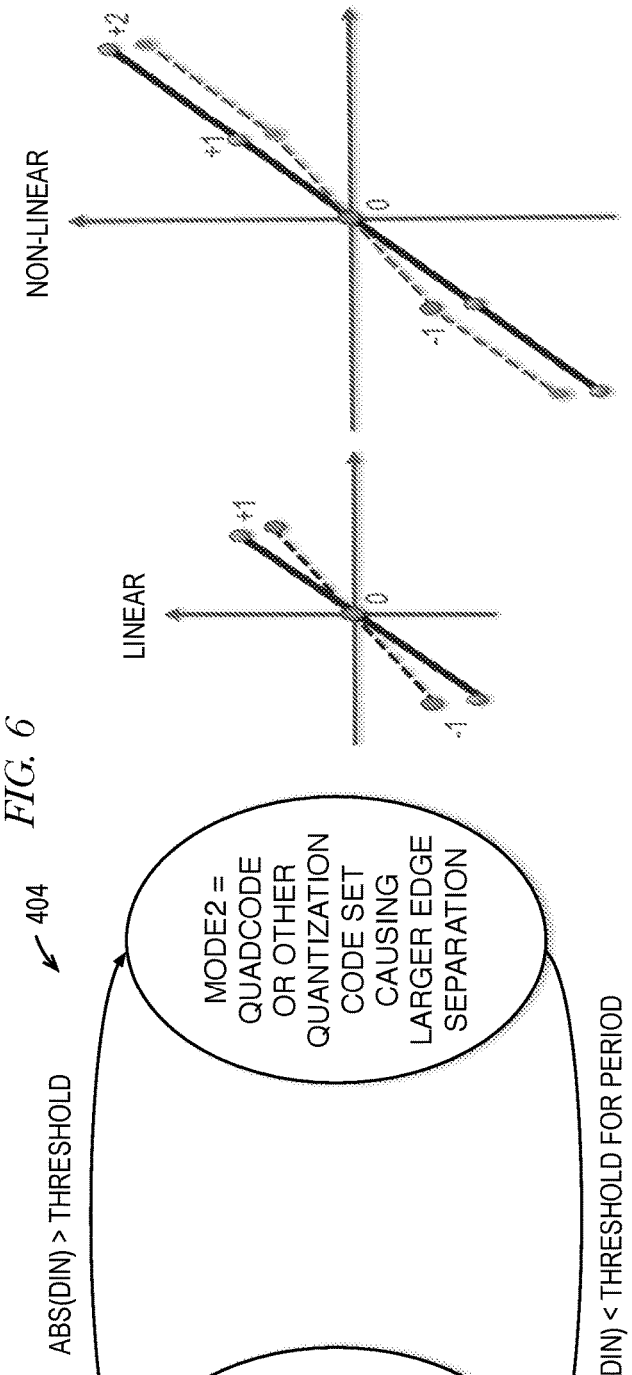
FIG. 6
FIG. 5

US 11,502,671 B2

DIGITAL PULSE-WIDTH MODULATION (PWM) MODULATOR WITH DYNAMICALLY SWITCHABLE CODE SET FOR REDUCED TOTAL HARMONIC DISTORTION AND NOISE (THDN)

BACKGROUND

The power efficiency of class-D amplifiers has made them an increasingly common solution in low power audio applications. A class-D amplifier may drive a pulse-width modulation (PWM) signal into a transducer (e.g., a speaker) to generate audio. It is desirable for the amplifier to have a low total harmonic distortion and noise (THDN) characteristic at its output. One source of THDN degradation may be inter-symbol interference (ISI). One attempt to address THDN degradation caused by ISI includes dynamically switching digital gain according to signal level. However, this approach may introduce significant pop-click noise because the modulator sees the gain jump because the digital gain switching is performed outside the feedback loop. Another source of THDN degradation may be quantization noise. Accordingly, techniques to ameliorate THDN degradation caused by ISI and quantization noise are desirable.

SUMMARY

In one embodiment, the present disclosure provides a digital pulse-width modulation (PWM) modulator that modulates a digital input signal to drive a digital PWM signal to a PWM digital-to-analog converter (DAC) that is susceptible to introducing inter-symbol interference (ISI) in the presence of small edge separation of the digital PWM signal causing degradation of total harmonic distortion and noise (THDN) of an audio system that comprises the digital PWM modulator and the DAC. The digital PWM modulator includes a state machine configured to generate a control signal based on the digital input signal. The digital PWM modulator also includes a multi-bit quantizer switchable into at least first and second modes in response to the control signal. The quantizer is configured to quantize the digital input signal into a quantized output signal. Each sample of the quantized output signal has a code selected from a first set of quantization codes when operating in the first mode and a code selected from a second set of quantization codes when operating in the second mode. The second set of quantization codes, relative to the first set of quantization codes, causes the digital PWM signal to have increased edge separation to reduce the ISI.

In another embodiment, the present disclosure provides a method for reducing total harmonic distortion and noise (THDN) of an audio system that comprises a digital pulse-width modulation (PWM) modulator that modulates a digital input signal to drive a digital PWM signal to a PWM digital-to-analog converter (DAC) that is susceptible to introducing inter-symbol interference (ISI) in the presence of small edge separation of the digital PWM signal causing THDN degradation. The method includes generating, by a state machine, a control signal based on the digital input signal to switch a multi-bit quantizer into at least first and second modes. The method also includes quantizing, by the quantizer, the digital input signal into a quantized output signal. Each sample of the quantized output signal has a code selected from first and second sets of quantization codes of the respective first and second modes. The second set of quantization codes, relative to the first set of quantization codes, causes the digital PWM signal to have increased edge separation to reduce the ISI.

BRIEF DESCRIPTION OF THE DRAWINGS

FIG. 4 is an example block diagram illustrating an embodiment of the digital PWM modulator of FIG. 1 in accordance with embodiments of the present disclosure.

FIG. 5 is an example state machine diagram illustrating operation of the state machine of the digital PWM modulator of FIG. 4 in accordance with embodiments of the present disclosure.

FIG. 6 is an example pair of graphs illustrating linearity maintained and non-linearity introduced through use of different quantization codes in accordance with embodiments of the present disclosure.

DETAILED DESCRIPTION

Figure 1:
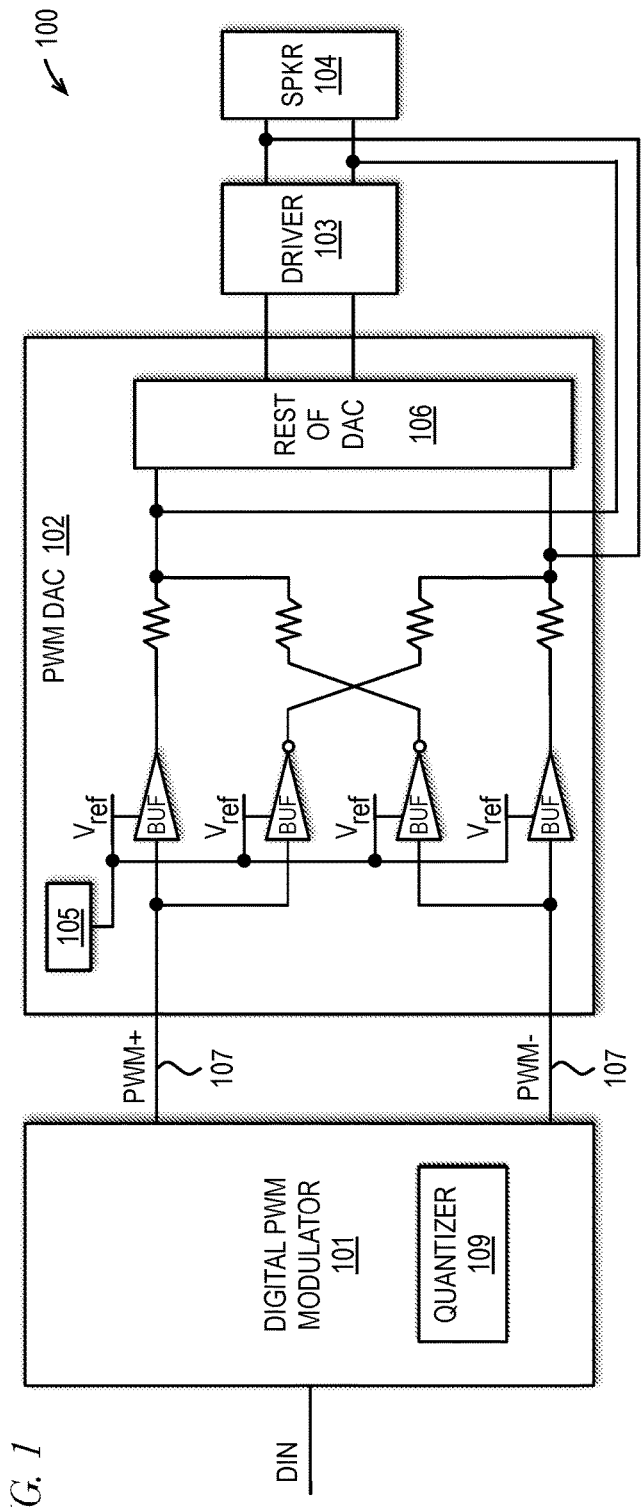
FIG. 1 is an example block diagram illustrating a class-D amplifier having a digital PWM modulator that includes a digital PWM quantizer whose set of quantization codes are dynamically switchable in accordance with embodiments of the present disclosure.

FIG. 1 is an example block diagram illustrating a class-D amplifier 100 having a digital PWM modulator 101 that includes a digital PWM quantizer whose set of quantization codes are dynamically switchable in accordance with embodiments of the present disclosure. The class-D amplifier 100 includes the digital PWM modulator 101, a PWM digital-to-analog converter (DAC) 102 and a driver 103 that drives an audio transducer 104 (e.g., speaker). The output of the driver 103 is fed back into the PWM DAC 102.

The digital PWM modulator 101 receives a digital input signal DIN. The digital PWM modulator 101 modulates the digital input signal DIN to generate a PWM output signal 107 indicated as PWM+ and PWM− in FIG. 1, that is provided as an input signal to the PWM DAC 102. In one embodiment, the digital PWM modulator 101 is a delta-sigma modulator.

The PWM DAC 102 converts the PWM output signal 107 to an analog voltage that is provided to the driver 103. The PWM DAC 102 includes a voltage reference generator 105 that generates a voltage reference $V_{ref}$. The PWM DAC 102 also includes buffers BUF that share a common voltage reference $V_{ref}$. In the embodiment of FIG. 1, the PWM DAC 102 includes two complementary pairs of buffers BUF, one pair receiving the PWM+ output signal 107 and the other pair receiving the PWM− output signal 107. The outputs of the two buffer BUF pairs are cross-coupled to generate a positive and negative output signal pair provided to the rest of the PWM DAC 106. The rest of the PWM DAC 106 may include one or more integrators, a quantizer and a feedback and/or a feed-forward path. In one embodiment, the PWM DAC 102 operates as an analog modulator.

The PWM modulator 101 includes a quantizer 109 that quantizes the digital input signal DIN into a quantized signal that is then converted into the PWM output signal 107, as described in more detail below with respect to FIG. 4. The quantized signal output by the quantizer 109 takes on discrete values, e.g., integer values within a range. The discrete values output by the quantizer 109 are referred to as quantization codes, and the set of possible quantization codes that a quantizer 109 may output are referred to as a quantization code set. Embodiments are described herein in which the quantizer 109 is capable of being switched between operation in two different modes, and in the two different modes, the quantizer 109 is capable of outputting quantization codes from two different quantization code sets in order to improve THDN over the range of the level of the input signal.

The PWM modulator 101 attempts to output a PWM output signal, which is formed from the quantized signal output by the quantizer 109, that is indicative of the digital input signal DIN. Thus, the quantizer 109 outputs a stream of quantization codes that are indicative of the digital input signal DIN. The stream of quantization codes may take on any value in the current quantization code set, which may include small-magnitude values, i.e., close to zero, and large-magnitude values, i.e., close to the largest magnitude values in the range of the quantization code set, and values in between.

Figure 2:
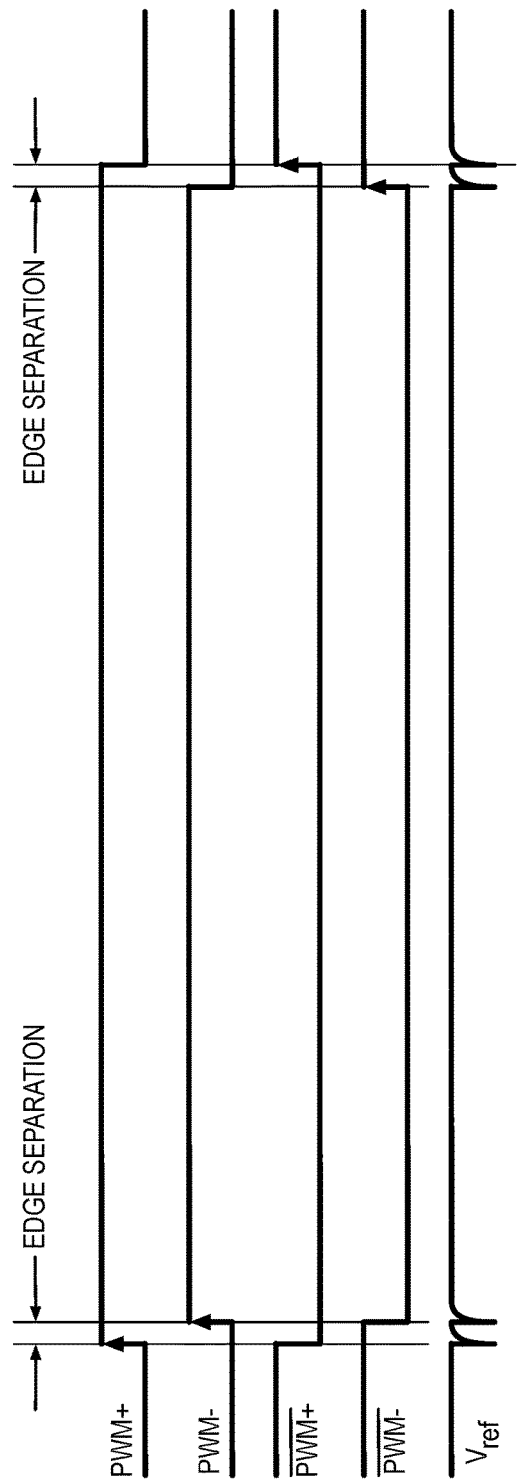
FIG. 2 is an example signal diagram illustrating a source of inter-symbol interference (ISI) in a class-D amplifier such as that of FIG. 1 in accordance with embodiments of the present disclosure.

FIG. 2 is an example signal diagram illustrating a source of inter-symbol interference (ISI) in a class-D amplifier 100 such as that of FIG. 1 in accordance with embodiments of the present disclosure. The positive and negative PWM output signals 107 (PWM+ and PWM−) of FIG. 1 and their complements are shown. The duty cycle of the PWM output signal is determined by the time difference between the positive and negative outputs PWM+ and PWM−. As shown, the edge separation is defined as the time between the rising edges of the positive and negative outputs PWM+ and PWM− and the time between the falling edges of the positive and negative outputs PWM+ and PWM−. The edge separation is half the duty cycle in the example of FIG. 2 because the initial and terminal portions of the duty cycle are symmetric in the example shown. Thus, the smaller the duty cycle, the smaller the edge separation may be. Generally speaking, the higher the level of the digital input signal DIN, the greater the likelihood the duty cycle and the edge separation of the PWM output signal 107 may be large, and the lower the level of the digital input signal DIN, the greater the likelihood the duty cycle and the edge separation of the PWM output signal 107 may be small. In the example of FIG. 2, the edge separation is relatively small.

Figure 3:
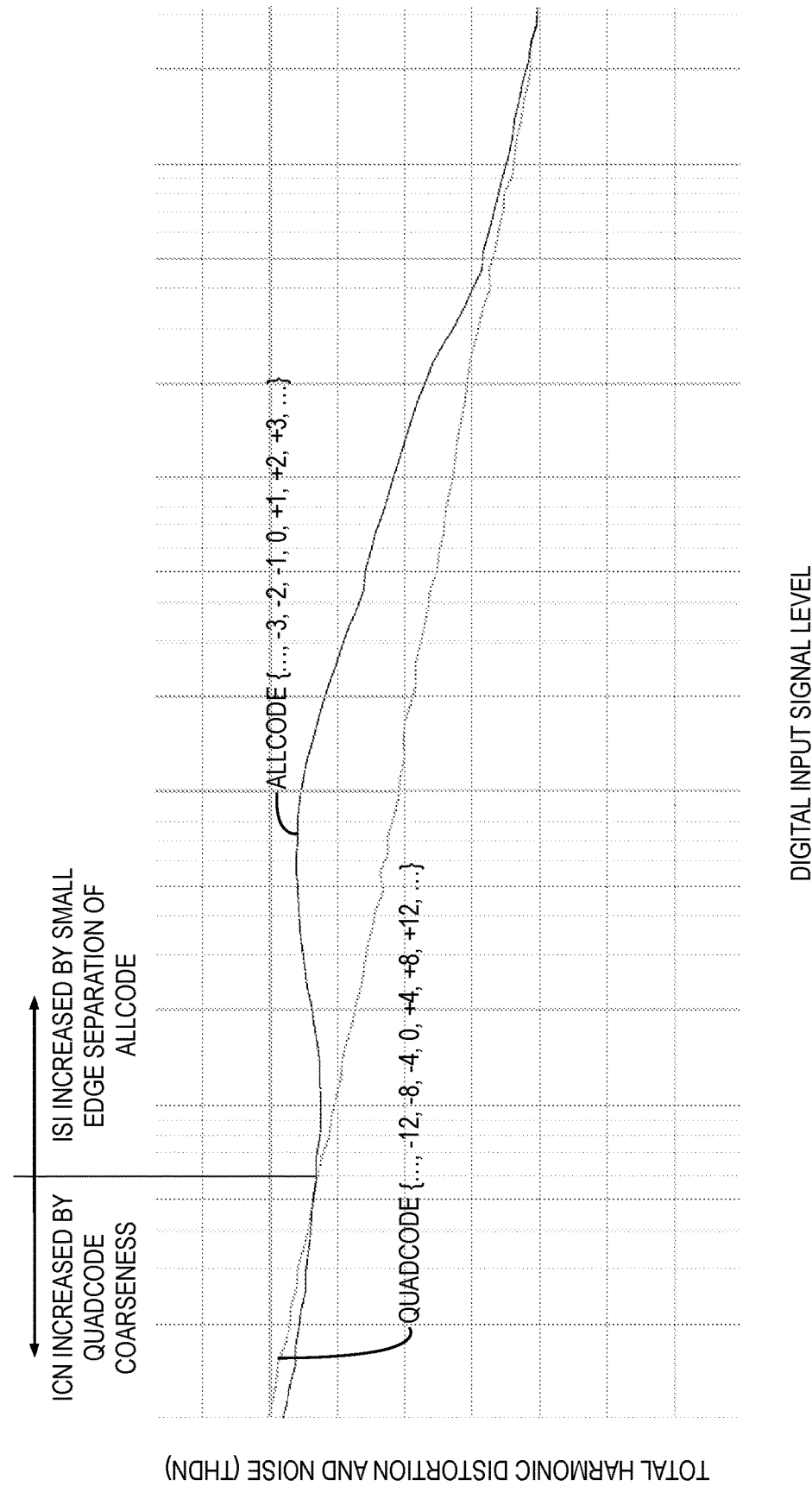
FIG. 3 is an example graph showing THDN in a class-D amplifier.

Significant THDN degradation has been observed in class-D amplifiers around a range of the level of the digital input signal (e.g., DIN of FIG. 1), as shown in FIG. 3 discussed more below. A root cause of the THDN degradation has been traced to the reference voltage $V_{ref}$ of FIG. 1 used to convert the PWM output signal 107 to an analog voltage and that is shared between the positive and negative PWM output signals 107 (PWM+ and PWM−). More specifically, when the edge separation of the PWM output signal 107 is small in time (e.g., when the level of the digital input signal DIN is low), the shared reference voltage $V_{ref}$ may not have time to settle from the disturbance caused by the edge transition, as may be observed in FIG. 2, which may introduce ISI that increases THDN.

FIG. 3 is an example graph showing THDN in a class-D amplifier. THDN is graphed as a logarithmic function of the level of the digital input signal DIN. As described above, the quantizer 109 of the described embodiments is configured to operate in two different modes having respective quantization code sets. The quantizer 109 may be dynamically switched between the two modes, and hence, two quantization code sets. However, to illustrate THDN degradation of a conventional class-D amplifier not having the benefit of dynamic switching between quantization code sets, two curves are shown in FIG. 3 that show two results of using a single quantization code set.

One curve graphs THDN when a set of quantization codes referred to as ALLCODE is used; the other curve graphs THDN when a set of quantization codes referred to as QUADCODE is used, as shown, that is, each of the two curves graphs THDN when a static quantization code set quantizer is used. The finer ALLCODE quantization code set includes all integer values between a negative maximum and a positive maximum, including zero, e.g., {MAX_NEG, . . . , −3, −2, −1, 0, +1, +2, +3, . . . , MAX_POS}. The coarser QUADCODE quantization code set includes integer values symmetrically rounded to multiples of four between the negative maximum and the positive maximum, including zero, e.g., {MAX_NEG, . . . , −12, −8, −4, 0, +4, +8, +12, . . . , MAX_POS}.

As may be observed from FIG. 3, there is a first/lower range of the level of the digital input signal DIN in which THDN degradation is observed when using the QUADCODE quantization code set relative to use of the ALLCODE quantization code set, and there is a second/higher range in which THDN degradation is observed when using the ALLCODE quantization code set relative to use of the QUADCODE quantization code set. As alluded to above, the THDN degradation in the higher range is attributable to ISI induced by small edge separation associated with small magnitude quantization codes, i.e., close to zero, e.g., −2, −1, +1, +2. However, the THDN degradation in the higher range of the ALLCODE relative to the QUADCODE—caused by the small edge separation-induced ISI caused by the small magnitude ALLCODE values—is mitigated by elimination of the small magnitude ALLCODE values (e.g., −3, −2, −1, 0, +1, +2, +3) from the QUADCODE and the accompanying larger edge separation that resulted in reduced ISI and THDN.

However, the elimination of the small magnitude codes from the coarser QUADCODE comes at the expense of THDN degradation in the lower range in the form of quantization noise at low levels of the digital input signal, also referred to as idle channel noise (ICN), as shown in the left-hand side of FIG. 3. Generally speaking, the ICN is degraded by approximately 6 dB at the digital output signal for each half of the number of quantization codes and, depending upon the performance of the analog portion of the amplifier and level of dynamic range enhancement (DRE), the effect is typically on the order of a few dB at the output of the amplifier. A possible solution to improve the ICN is to lower the analog gain; however, this solution may introduce significant additional hardware cost. Advantageously, a digital solution to reduce or eliminate the THDN degradation caused by the shared voltage reference-induced ISI without impacting ICN that does not introduce significant additional hardware cost is described with respect to the embodiments herein. Specifically, embodiments of a quantizer whose quantization code set may be dynamically switched, based on the level of the digital input signal, between a first code set characterized by increased edge separation at higher input signal levels and a second code set characterized by more small-magnitude quantization codes at lower input signal levels, will now be described.

FIG. 4 is an example block diagram illustrating an embodiment of the digital PWM modulator 101 of FIG. 1 in accordance with embodiments of the present disclosure. The digital PWM modulator 101 includes a loop filter 402, multi-mode quantizer 109, a PWM encoder 408, and a level detector and state machine 404 that receive a period 412 and a threshold 414. The loop filter 402 receives and filters the digital input signal DIN. The output 433 of the loop filter 402 is provided as an input to the multi-mode quantizer 109. The level detector and state machine 404 also receives the digital input signal DIN and generates a control signal 415 provided to the multi-mode quantizer 109. The quantizer 109 quantizes the output 433 of the loop filter 402 to generate a quantized output signal 435. The PWM encoder 408 encodes the quantized output 435 into the PWM output signal 107 of FIG. 1. The quantized output 435 is fed back to the loop filter 402. The quantizer 109 may be a multi-bit digital quantizer.

The loop filter 402 includes a first summing element that sums the digital input signal DIN and an inverted version of the fed back quantized output 435. The loop filter 402 includes a sequence of integrators shown as 421, 423 and 425, whose outputs successively feed the input of the next integrator and whose outputs are summed by a second summing element whose output is the output 433 of the loop filter 402. In one embodiment, the loop filter 402 and quantizer 109 operate as a closed loop delta-sigma modulator.

The multi-mode quantizer 109 is configured to be capable of switching between at least two modes in response to the control signal 415 provided by the state machine 404. A first mode has an associated first set of quantization codes, and a second mode has an associated second set of quantization codes. That is, when operating in the first mode, the quantizer 109 outputs values on the quantized output 435 from the first quantization codes set, and when operating in the second mode, the quantizer 109 outputs values on the quantized output 435 from the second quantization codes set. The first quantization code set has the characteristic it tends to cause low quantization noise relative to the second quantization code set. For example, the ALLCODE tends to cause low quantization noise relative to the QUADCODE because the QUADCODE is coarser (i.e., has larger steps) than the ALLCODE. More specifically, the first quantization code set includes a zero code, a positive code nearest zero (e.g., +1) and a negative code nearest zero (e.g., −1) that are smaller in magnitude than positive and negative codes nearest zero (e.g., +4, −4) of the second quantization code set. In one embodiment, the first quantization code set includes only the three quantization codes $\{-1, 0, +1\}$. The second quantization code set has the characteristic it tends to cause large edge separation relative to the first quantization code set. For example, the QUADCODE tends to cause large edge separation relative to the ALLCODE because the QUADCODE does not include the small codes near zero, e.g., ±1, ±2, ±3 that the ALLCODE includes. In one embodiment, the second quantization code set is formed by symmetric rounding, e.g., by four to create the QUADCODE, or by different factor than four. In one embodiment, the second quantization code set is the ALLCODE but with the ±1, ±2, ±3 codes discarded.

The level detector 404 takes the absolute value (i.e., magnitude) of the digital input signal DIN and provides the magnitude to the state machine 404. The state machine 404 compares the magnitude with the threshold 414. As shown in the state diagram of FIG. 5, if the magnitude of the digital input signal DIN rises above the threshold 414, the state machine 404 changes state to a state associated with the second mode (MODE2) and outputs a value on the control signal 415 to cause the quantizer 109 to switch to the second mode. As also shown in the state diagram of FIG. 5, if the magnitude of the digital input signal DIN falls below the threshold 414 and remains below the threshold for the period 412 (i.e., without rising above the threshold for the period 412), the state machine 404 changes state to a state associated with the first mode (MODE1) and outputs a value on the control signal 415 to cause the quantizer 109 to switch to the first mode. The use of the period 412 by the state machine 404 advantageously operates to provide some hysteresis to avoid excessive switching back and forth between the two modes, e.g., may ensure that the digital input signal DIN power is sufficiently low before switching back to the first mode. In particular, the period 412 may be programmable and may be set based on the bandwidth of the digital input signal DIN. The prevention of excessive switching may enable the closed loop to noise shape and filter out noise caused by the switching. The threshold 414, or switch point, may also be programmable and is preferably set to a relatively low value of the digital input signal DIN in order to minimize the switch nonlinearity. To illustrate with reference to the example in FIG. 3, the threshold 414 may be set to a value near the point where the ALLCODE and QUADCODE curves intersect in the area associated with lower values of the digital input signal DIN in the left-hand side of the graph. In one embodiment, an efficient leading zero calculation algorithm may be used to detect the level of the digital input signal DIN, e.g., with an approximately 6 dB step. In other embodiments, the step may be more refined.

Advantageously, the embodiments of FIGS. 2, 4 and 5 may provide improved THDN degradation performance over conventional approaches. The approach of the embodiments is taken from an observation that for relatively low levels of the digital input signal DIN, e.g., below a well-chosen value of the threshold 414, even if the edge separation of the PWM output signal 107 is small, there is little or no THDN degradation because the quantized output signal 435 is dominated by density modulation of three values: −1, 0, +1. That is, even in the presence of small edge separation-induced shared reference voltage $V_{ref}$ ISI and hence level distortion, the digital PWM modulator 101 is still linear and symmetric, as shown in the left-hand graph of FIG. 6, resulting in no THD degradation. In contrast, as shown in the right-hand graph of FIG. 6, the ISI-based level distortion causes the digital PWM modulator 101 to be non-linear when the quantized output signal 435 is no longer dominated by density modulation of only the three values, i.e., for larger levels of the digital input signal DIN, e.g., above the threshold 414.

Figure 7:
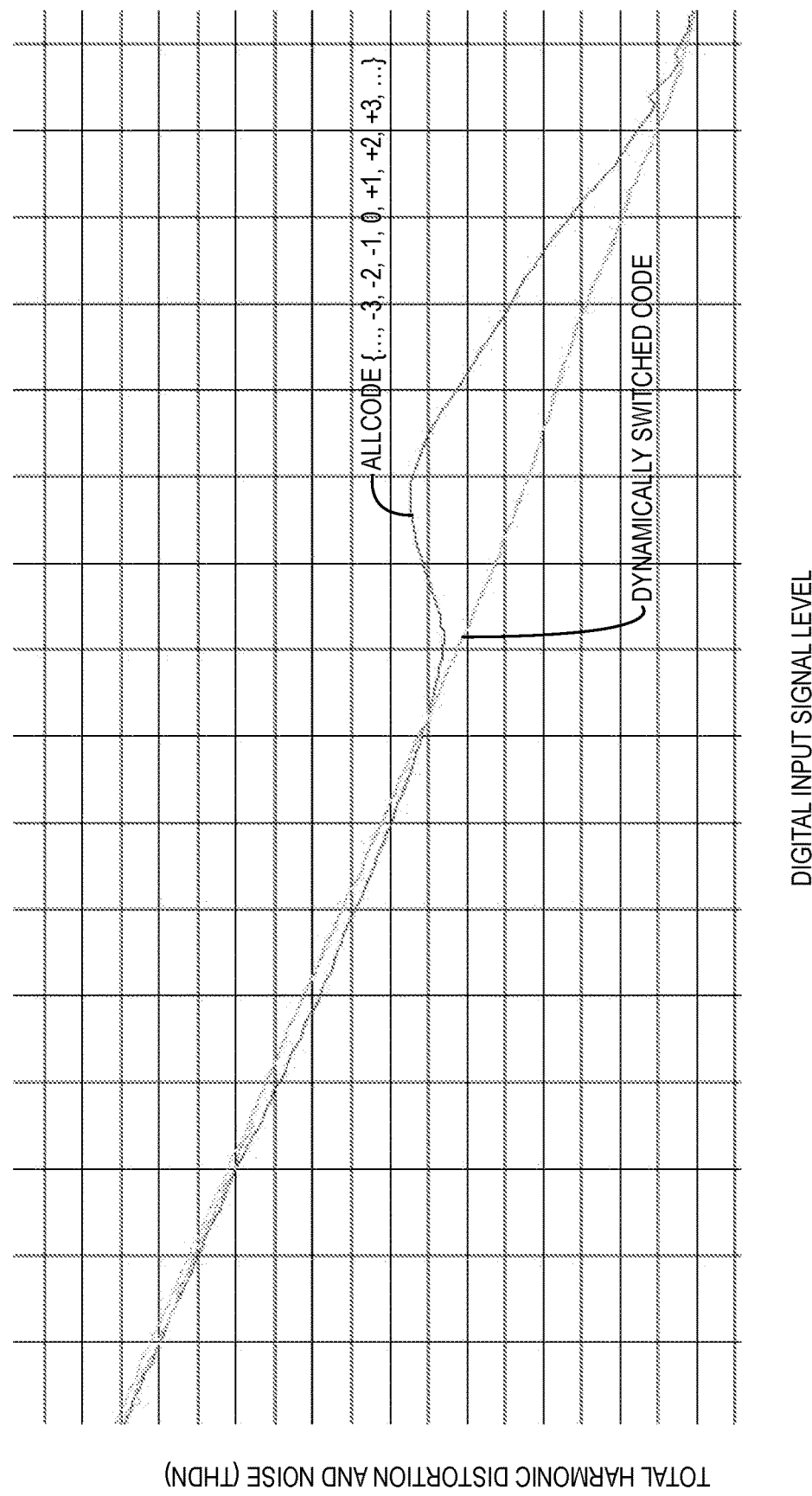
FIG. 7 is an example graph showing THDN in a class-D amplifier that includes a dynamically code set switchable quantizer for improved THDN in accordance with embodiments of the present disclosure.

Based on these observations, embodiments have been described in which the quantizer 109 is dynamically switched to the first quantization code set for low levels of the digital input signal DIN in which only three quantization codes $\{-1, 0, +1\}$ are the predominant output values resulting in better THDN performance through reduced quantization noise and maintained linearity even in the presence of small edge separation-induced ISI, as described above. The quantizer 109 is dynamically switched to the second quantization code set for higher levels of the digital input signal DIN, at which digital noise (i.e., quantization noise) is not as critical (i.e., is smaller relative to THD), to enjoy increased edge separation in order to reduce shared voltage reference $V_{ref}$ ISI by giving the shared voltage reference $V_{ref}$ more time to settle from the disturbance caused by the edge transition, resulting in improved THDN performance. In summary, the ability of the quantizer 109 to switch between the two quantization code sets reduces shared voltage reference $V_{ref}$ ISI at higher levels of the digital input signal DIN and avoids impacting ICN at lower levels of the digital input signal DIN by maintaining linearity even in the presence of level distortion due to ISI and thus reduces overall THDN degradation. Additionally, the switch between the two quantization code sets is made inside the closed loop of the PWM modulator 101 that enables any noise that might otherwise be introduced by the switching to be filtered out thereby avoiding undesirable side effects such as pop-click noise. FIG. 7 illustrates an example graph showing THDN in a class-D amplifier that includes a dynamically code set switchable quantizer for improved THDN in accordance with embodiments of the present disclosure. One curve graphs THDN when ALLCODE is used; the other curve graphs THDN when dynamic switching between quantization codes is used as described above, as shown. In FIG. 7, the dynamic switching is performed between the ALLCODE and QUADCODE for the second curve.

The following advantages may be enjoyed by the described embodiments relative to conventional approaches. First, by facilitating use of a shared reference voltage in the analog DAC that converts the PWM output of the PWM modulator that includes the switchable quantization code set quantizer, the embodiments avoid increasing area and power in the analog DAC which cost would be incurred by a solution that would employ separate reference voltages. Instead, a low-cost digital solution for improving THDN is provided. Second, the embodiments may maintain low ICN while avoiding introducing unacceptable levels of pop-click noise because the quantization code set switching is performed inside the closed loop such that it is filtered. Third, the embodiments avoid additional design cost that might be incurred by making relative gain adjustments between the digital and analog modulator portions of the class-D amplifier, e.g., increasing digital modulator gain to increase edge separation and reducing analog modulator gain and to maintain the same signal level.

It should be understood—especially by those having ordinary skill in the art with the benefit of this disclosure—that the various operations described herein, particularly in connection with the figures, may be implemented by other circuitry or other hardware components. The order in which each operation of a given method is performed may be changed, unless otherwise indicated, and various elements of the systems illustrated herein may be added, reordered, combined, omitted, modified, etc. It is intended that this disclosure embrace all such modifications and changes and, accordingly, the above description should be regarded in an illustrative rather than a restrictive sense.

Similarly, although this disclosure refers to specific embodiments, certain modifications and changes can be made to those embodiments without departing from the scope and coverage of this disclosure. Moreover, any benefits, advantages, or solutions to problems that are described herein with regard to specific embodiments are not intended to be construed as a critical, required, or essential feature or element.

Further embodiments, likewise, with the benefit of this disclosure, will be apparent to those having ordinary skill in the art, and such embodiments should be deemed as being encompassed herein. All examples and conditional language recited herein are intended for pedagogical objects to aid the reader in understanding the disclosure and the concepts contributed by the inventor to furthering the art and are construed as being without limitation to such specifically recited examples and conditions.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative.

Finally, software can cause or configure the function, fabrication and/or description of the apparatus and methods described herein. This can be accomplished using general programming languages (e.g., C, C++), hardware description languages (HDL) including Verilog HDL, VHDL, and so on, or other available programs. Such software can be disposed in any known non-transitory computer-readable medium, such as magnetic tape, semiconductor, magnetic disk, or optical disc (e.g., CD-ROM, DVD-ROM, etc.), a network, wire line or another communications medium, having instructions stored thereon that are capable of causing or configuring the apparatus and methods described herein.

The invention claimed is:

1. A digital pulse-width modulation (PWM) modulator that modulates a digital input signal to drive a digital PWM signal to a PWM digital-to-analog converter (DAC) that is susceptible to introducing inter-symbol interference (ISI) in the presence of small edge separation of the digital PWM signal causing degradation of total harmonic distortion and noise (THDN) of an audio system that comprises the digital PWM modulator and the DAC, comprising:
   a state machine configured to generate a control signal based on the digital input signal;
   a multi-bit quantizer switchable into at least first and second modes in response to the control signal, wherein the quantizer is configured to quantize the digital input signal into a quantized output signal, wherein each sample of the quantized output signal has a code selected from a first set of quantization codes when operating in the first mode and a code selected from a second set of quantization codes when operating in the second mode; and
   wherein the second set of quantization codes, cause the digital PWM signal to have increased edge separation relative to edge separation of the digital PWM signal caused by the first set of quantization codes to reduce the ISI.

2. The digital PWM modulator of claim 1,
   wherein the state machine is configured to switch the quantizer out of the first mode when the digital input signal rises above a threshold;
   wherein the first set of quantization codes comprises a zero code, a positive code nearest zero and a negative code nearest zero, and wherein the positive and negative codes nearest zero of the first set are smaller in magnitude than positive and negative codes nearest zero of the second set of quantization codes; and
   wherein the threshold comprises a level of the digital input signal that is sufficiently low to cause the quantized output signal to be dominated by density of the zero code, the positive code nearest zero and the negative code nearest zero to reduce quantization noise at levels of the digital input signal below the threshold.

3. The digital PWM modulator of claim 2, wherein the state machine is configured to switch the quantizer out of the second mode when the digital input signal falls below the threshold for at least a period.

4. The digital PWM modulator of claim 3, wherein the period is programmable.

5. The digital PWM modulator of claim 1, wherein the digital PWM signal drives complimentary buffers of the PWM DAC that share a voltage reference.

6. The digital PWM modulator of claim 1, wherein the second set of quantization codes, cause the digital PWM signal to have increased edge separation relative to edge separation of the digital PWM signal caused by the first set of quantization codes because quantization codes close to zero that are included in the first set of quantization codes are discarded from the second set of quantization codes.

7. The digital PWM modulator of claim 1, wherein the second set of quantization codes, cause the digital PWM signal to have increased edge separation relative to edge separation of the digital PWM signal caused by the first set of quantization codes by symmetrically rounding the first set of quantization codes to a sparser set of quantization codes.

8. The digital PWM modulator of claim 1, wherein the digital PWM modulator comprises a delta-sigma modulator.

9. The digital PWM modulator of claim 1, further comprising:
a loop filter configured to receive the digital input signal, wherein an output of the loop filter is provided as an input to the multi-bit quantizer; and
wherein the quantized output signal is fed back as an input to the loop filter.

10. The digital PWM modulator of claim 1, further comprising:
a PWM encoder configured to encode the quantized output signal into the digital PWM signal.

11. A method for reducing total harmonic distortion and noise (THDN) of an audio system that comprises a digital pulse-width modulation (PWM) modulator that modulates a digital input signal to drive a digital PWM signal to a PWM digital-to-analog converter (DAC) that is susceptible to introducing inter-symbol interference (ISI) in the presence of small edge separation of the digital PWM signal causing THDN degradation, comprising:
generating, by a state machine, a control signal based on the digital input signal to switch a multi-bit quantizer into at least first and second modes;
quantizing, by the quantizer, the digital input signal into a quantized output signal, wherein each sample of the quantized output signal has a code selected from first and second sets of quantization codes of the respective first and second modes; and
wherein the second set of quantization codes, cause the digital PWM signal to have increased edge separation relative to edge separation of the digital PWM signal caused by the first set of quantization codes to reduce the ISI.

12. The method of claim 11, wherein said generating, by a state machine, a control signal based on the digital input signal to switch a multi-bit quantizer into at least first and second modes comprises switching the quantizer out of the first mode when the digital input signal rises above a threshold;
wherein the first set of quantization codes comprises a zero code, a positive code nearest zero and a negative code nearest zero, and wherein the positive and negative codes nearest zero of the first set are smaller in magnitude than positive and negative codes nearest zero of the second set of quantization codes; and
wherein the threshold comprises a level of the digital input signal that is sufficiently low to cause the quantized output signal to be dominated by density of the zero code, the positive code nearest zero and the negative code nearest zero to reduce quantization noise at levels of the digital input signal below the threshold.

13. The method of claim 12, wherein said generating, by a state machine, a control signal based on the digital input signal to switch a multi-bit quantizer into at least first and second modes comprises switching the quantizer out of the second mode when the digital input signal falls below the threshold for at least a period.

14. The method of claim 13, wherein the period is programmable.

15. The method of claim 11, wherein the digital PWM signal drives complimentary buffers of the PWM DAC that share a voltage reference.

16. The method of claim 11, wherein the second set of quantization codes, cause the digital PWM signal to have increased edge separation relative to edge separation of the digital PWM signal caused by the first set of quantization codes because quantization codes close to zero that are included in the first set of quantization codes are discarded from the second set of quantization codes.

17. The method of claim 11, wherein the second set of quantization codes, cause the digital PWM signal to have increased edge separation relative to edge separation of the digital PWM signal caused by the first set of quantization codes by symmetrically rounding the first set of quantization codes to a sparser set of quantization codes.

18. The method of claim 11, wherein the digital PWM modulator comprises a delta-sigma modulator.

19. The method of claim 11, further comprising:
receiving, by a loop filter, the digital input signal, wherein an output of the loop filter is provided as an input to the multi-bit quantizer; and
wherein the quantized output signal is fed back as an input to the loop filter.

20. The method of claim 11, further comprising:
encoding, by a PWM encoder, the quantized output signal into the digital PWM signal.

* * * * *